United States Patent [19]

McNeil et al.

[11] Patent Number: 4,758,304
[45] Date of Patent: Jul. 19, 1988

[54] METHOD AND APPARATUS FOR ION ETCHING AND DEPOSITION

[76] Inventors: John R. McNeil, 13423 Desert Hills, NE., Albuquerque, N. Mex. 87111; Scott R. Wilson, 1630 Grand, NE., #6, Albuquerque, N. Mex. 87106

[21] Appl. No.: 28,246

[22] Filed: Mar. 20, 1987

[51] Int. Cl.$^4$ .................. B44C 1/22; C03C 15/00; C23C 14/00; B05D 3/06
[52] U.S. Cl. .................. 156/626; 118/50.1; 118/620; 156/643; 156/654; 156/345; 204/192.11; 204/192.13; 204/192.34; 427/38
[58] Field of Search .............. 156/626, 643, 646, 654, 156/345; 204/192.1, 192.11, 192.13, 192.32, 192.33, 192.34, 298; 427/38, 39; 118/728, 50.1, 620

[56] References Cited

U.S. PATENT DOCUMENTS 4,450,031 5/1984 Ono et al. ........................ 156/345
4,457,803 7/1984 Takigawa ........................ 156/626
4,523,971 6/1985 Cuomo et al. ................... 156/345

Primary Examiner—William A. Powell
Attorney, Agent, or Firm—Albert Sopp; Robert W. Weig

[57] ABSTRACT

The disclosure relates to a method and apparatus using ion etching and ion assisted deposition to reform a surface of an object, such as a large lens, from its existing topography to a predetermined topography. The method comprises comparing the existing topography of the surface of the object to the predetermined topography. In one embodiment, the comparison can be used to distinguish objects having surfaces which are readily or economically reformable to the predetermined topography from those which are not suitable for such reforming. The method novelly utilizes an algorithm comprising image restoration. The ion etching structure of the apparatus comprises an ion source grid which can be used to provide an ion beam of a preselected spatial distribution. The grid is constructed of a nonconducting, vacuum compatible material, such as a ceramic sheet coated with a conductive layer on each side. Apertures are drilled through the grid in a selected pattern. The ion beam produced from a plasma source when a suitable voltage is applied across the coatings has a spatial distribution in accordance with the aperture pattern. In one embodiment the coatings comprise discrete corresponding areas on each surface and different voltages are appliable to each area to further control beam spatial distribution. Ion assisted deposition may be simultaneously performed under the algorithm to add material to the surface in accordance with the desired predetermined topography.

21 Claims, 5 Drawing Sheets

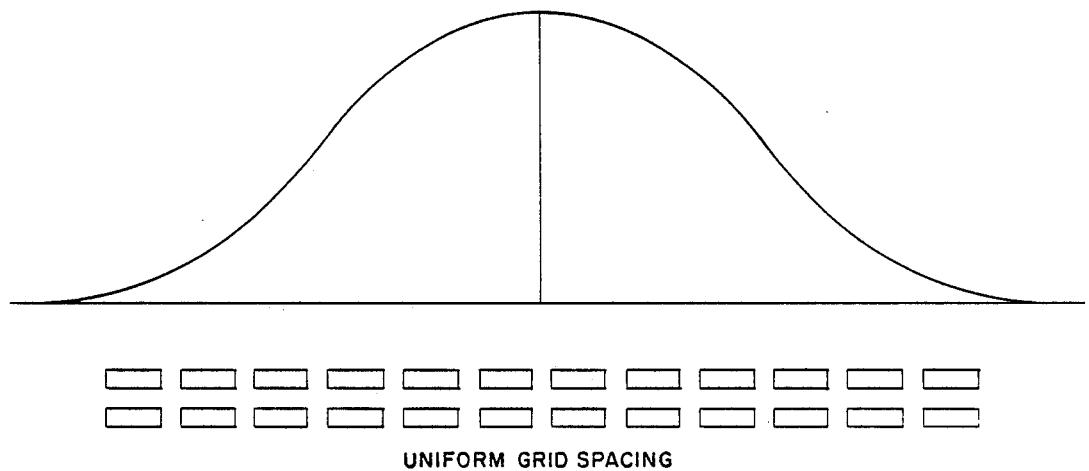
UNIFORM GRID SPACING
FIG — 7A
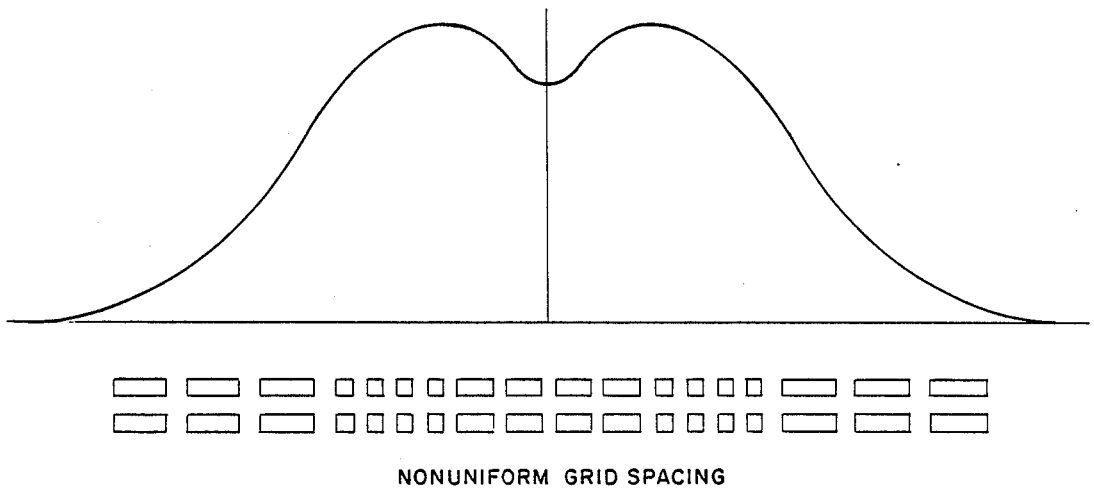
NONUNIFORM GRID SPACING
FIG — 7B

METHOD AND APPARATUS FOR ION ETCHING AND DEPOSITION

FIELD OF THE INVENTION

The invention relates to ion etching and ion assisted and other deposition and more particularly to ion etching existing surface topographies of objects to predetermined topographies in accordance with an algorithm using image restoration and to an ion source extraction grid apparatus providing selected ion beam spatial distribution.

BACKGROUND OF THE INVENTION

Precision optical components having physical surface height aberrations smaller than one wavelength of the incident radiation are of strategic importance to the operation of many optical systems. Such components are very expensive because of the enormous investment of time and sophisticated equipment required to fabricate and figure optical surfaces. Conventional methods of fabricating and figuring optical surfaces involve grinding surfaces into optics using abrasives. Although modern optic grinders have better abrasives, tools and even equipment under computer control, the physical process is essentially the same as it has been for hundreds of years.

Ion etching, also known as ion sputtering and ion milling, has been tried as an alternative process to abrasion. Ion sputtering is a physical process in which an ion is caused to impinge upon a surface of an object with sufficient energy to cause atoms or molecules of the object to be liberated from its surface.

Sputtering has become popular in the semiconductor industry. However, sputtering has not found use in modifying optical surfaces because efforts to use sputtering for optic surfacing were severely limited by the ion current from the ion sources available at the time. One type of ion source used in such attempts is known as a Cockraft-Walton accelerator. U.S. Pat. Nos. 3,548,189 to Meinel et al and 3,699,334 to Cohen et al illustrate such ion sources in their disclosed devices. Cockraft-Walton as well as other ion accelerators used in such attempts are only capable of driving a maximum beam current of a few hundred microamperes and produce quite high ion energies, often a fraction of an MeV. Limitations result from the fundamental design of such ion sources. For example, such sources contain only a single aperture for ion extraction. The ion current extractable from a single aperture s proportional to the voltage applied to the aperture which in turn determines the ion energy. The use of a single aperture as in the prior art thus mandates that high voltage be applied to the ion extraction aperture which results in high energy ions in order to obtain an ion current on the order of a hundred microamperes. Due to such limitations ion beam etching has been essentially unworkable.

In the late 1970's the Kaufman ion source as disclosed in the publication, Technology of Ion Beam Sources Used in Sputtering, Journal of Vacuum Science and Technology, Vol. 15, pp 272-276, March/April 1978 by H. R. Kaufman et al was developed. The Kaufman ion source is capable of producing beam currents of a large fraction of an ampere, at energies within the 300–1500 eV range. The beam is sufficiently controllable, stable and repeatable, to be satisfactory for use in surface modification devices. A Kaufman ion source having a grid structure in accordance with the invention can produce minimum current levels of at least about 200 times and optimally about 800 to 1500 times the current level of the Cockraft-Walton and other devices used previously in ion etching. Such Kaufman ion source beam current is on the order of 30 to 400 mA versus a Cockraft-Walton device beam current of less than 0.3 mA.

The ions used in the U.S. Pat. No. 3,548,189 device are of substantially the same energy and a uniform current density is necessary. Only narrow ion beam sources are used and selective deposition in combination with selective removal is not possible. Such devices are limited to the figuring of small diameter elements because beam deflection is used as the steering mechanism, the ion source not being translatable, i.e., movable. For large diameter optics, such as those having diameters on the order of one-half meter or more, the distance from the deflection plates to the surface would have to be near the diameter of the surface. Beam current loses due to residual gas in the chamber would be great and make the process very inefficient. Too, beam dwell pattern computation is not considered in such prior art devices and methods using image processing and systems theory for optimized material removal are not applied.

In devices such as that shown in U.S. Pat. No. 3,699,334, ion beam impingement control is limited to electrostatic and magnetic deflection of the beam and to rotation of the object to be etched. In practicing the invention the ion source is itself moved. The ion sources used in the prior art are either constructed as an integral part of the vacuum system containing the object to be etched or they are external to the vacuum system and connected thereto by a tube which is evacuated with the vacuum system. No such prior art systems utilize translatable ion sources. Too, the ion beam is necessarily maintained continuously in such prior art devices in part because of the high voltages involved in extracting 20 kV to 100 kV ions. Dwell computations are based on a two step method in which the symmetrical errors need first be reduced to zero. Then isolated symmetrical errors are removed. In practicing the invention all errors, symmetrical and nonsymmetrical, are removed in one step. Nonsymmetrical and arbitrarily shaped beam objects can not be figured with such prior art devices. In addition the beam energies of the prior art devices, 20 to 100 kV, are known to damage many materials. The apparatus of the invention operates at a maximum energy of about two kV. The prior art beam taught by the U.S. Pat. No. 3,699,334 only focuses the ion beam to a diameter between one and five millimeters whereas that of the invention focuses the ion beam within a two to five centimeter and larger range to enable the correction of a wide range of sizes of surface aberrations for more efficiently than with prior art devices. The ion source used in accordance with the invention provides electrons to avoid the electric charge effects requiring a separate source of electrons in prior art devices.

Thus, it can be seen that the prior art devices and methods can not figure large surfaces and can not use both removal and deposition to figure a surface. Such devices are limited to low current, high energy, narrow beam ion sources and there is no control of beam current spatial distribution. Large and non-symmetric surfaces can not be etched by such devices and methods.

SUMMARY OF THE INVENTION

In accordance with the invention, there is provided a method and apparatus for etching a selected surface of an object from its existing topography to a predetermined topography by comparing the existing topography to the predetermined topography and using an algorithm comprising image restoration and an ion beam to selectively remove material from the surface. The algorithm may also control deposition to deposit material on the surface to reach the predetermined topography. The algorithm comprises the use of nonlinear windowing techniques followed by an image restoration step to generate a beam dwell array which will yield the desired or predetermined topography. The method can be used to provide nonsymmetric as well as symmetric surface topography and to determine whether an existing surface topography is suitable for etching or deposition in accordance with preselected citeria. The ion beam used is preferably high current, low energy and broad. Surface extrapolations may be used to avoid edge effects. High curvature and complex surfaces may be formed. An ion source grid apparatus for extracting ions from a plasma source in accordance with the invention comprises a sheet of nonconducting vacuum compatible material, such as a ceramic, having conductive coatings on each surface. A plurality of apertures penetrate the coatings and the sheet of material in a predetermined pattern to provide an ion beam having a preselected spatial distribution when a voltage is applied across the coatings. The coatings may be disposed in a plurality of corresponding discrete areas on each side of the sheet of material, corresponding areas being provided with selected voltages thereacross to provide an ion beam having a desired spatial distribution. The voltages may be controllable to change to spatial distribution. The area and aperture patterns may comprise concentric circles about a central circular area.

One object of the present invention is to selectively etch the surfaces of large diameter objects.

Another object of the invention is to control ion beam current spatial distribution.

Yet another object of the present invention is to use selective material removal and deposition to figure the surface of an object.

Still another object of the invention is to provide predetermined symmetric and nonsymmetric surfaces.

Another object of the invention is to determine which objects are suitable for etching or deposition in accordance with preselected criteria.

One advantage of the present invention is that in accordance therewith, large diameter optics and other elements can be economically produced.

Another advantage of the present invention is that in accordance therewith a high current, low energy, broad ion beam can be used to etch a desired surface configuration on an object.

Yet another advantage of the invention is that surface extrapolations can be used to avoid edge effects.

Still another advantage is that high surface curvature and complex surfaces can be figured.

Yet another advantage of the invention is that an object may have its surface figured, then evaluated for acceptability, and have subsequent operations such as thin film coating performed thereon without the object being removed from a vacuum system.

Still another advantage is that delicate and lightweight objects can be figured because there is no weight loading on the object in practicing the invention as in conventional grinding or milling methods.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and form a part of the specification, illustrate the invention, and together with the description, serve to explain the principles of the invention. In the drawings:

FIGS. 7A and 7B show how ion beam spatial distribution may be predetermined by aperture placement in the embodiment of FIGS. 3A and 3B.

DETAILED DESCRIPTION OF THE INVENTION

Figure 1:
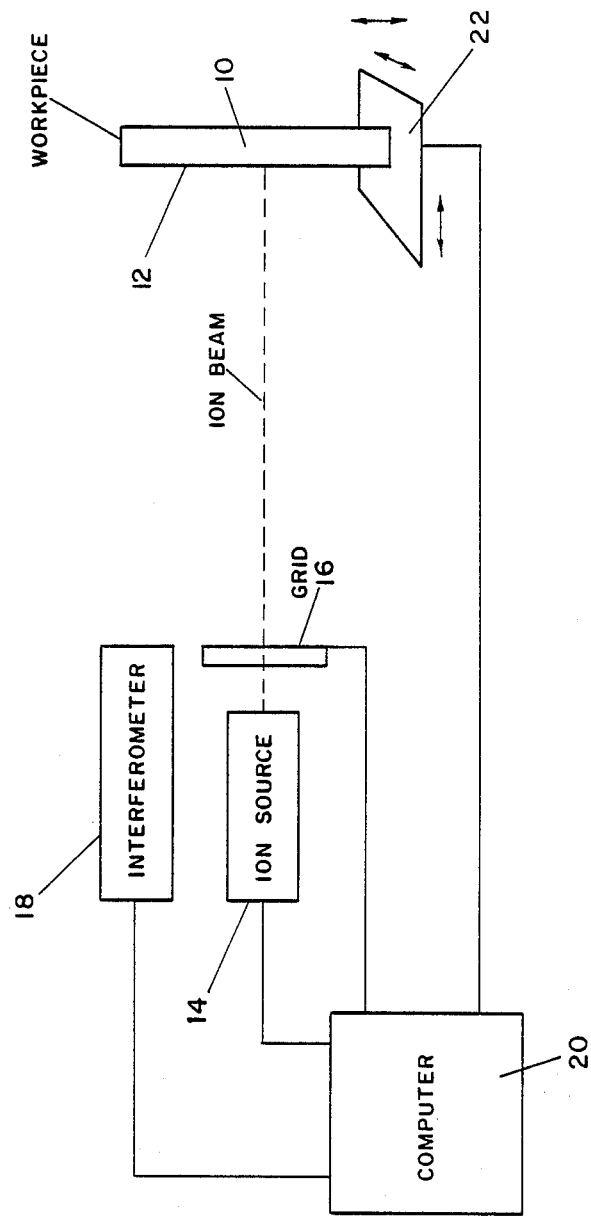
FIG. 1 illustrates a system for performing the method of the invention.

Reference is now made to FIG. 1 which illustrates a system suitable for carrying out the method of the invention. As seen therein an object 10 having a surface 12, beam source 14, an ion source grid 16 and an interferometer or other surface determining or monitoring instrument 18 such as a phase measuring interferometer or heterodyne interferometer are positioned within a vacuum chamber (not shown). A computer 20 is operatively connected to an apparatus 22 for controlling the position of object 10. Beam source 14 and ion source grid 16 are also under the control of computer 20 as is monitoring instrument 18. Ion source 14 is preferably a Kaufman ion source such as disclosed in a publication, *Fundamentals of Ion-Source Operation* by Harold R. Kaufman, Library of Congress Catalog Card Number 84-71750. Kaufman sources are well known and produce high current, low energy broad ion beams containing nearly monoenergetic ions so that beam sputtering therewith is essentially a linear process. The removal profile of the beam from source 14 is essentially the same regardless of where on the surface 12 of object 10 beam 24 is directed. Thus, sputtering yield remains constant. Beam source 14 and/or object 10 is translatable so that in operation the beam 24 remains normal, or at another selected fixed angle, to surface 12 or to a reference plane or surface. The beam 24 does not diverge appreciably and its current energy distribution remains substantially constant during operation. Beam source 14 may additionally comprise a sputter magnetron or other device for ion assisted or other deposition.

In accordance with the invention an algorithm compares a desired predetermined surface topography with the existing surface topography of surface 12 on object 10 and utilizing image restoration, controls beam 24 to ion etch surface 12 to produce the predetermined surface topography. The predetermined topography may be symmetric or nonsymmetric and ion assisted deposition may be also used to figure surface.

In practicing the invention, ion etching and ion depositing beam figuring is controlled using deconvolution for nearly flat optics, and matrix computations for optical and other elements having large surface slopes and high curvatures. The model for figuring computation begins with the superposition integral, $$f(x,y) - d(x,y) = \int_{-\infty}^{\infty} \int_{-\infty}^{\infty} t(a,B)h(x,a,y,B)dadB \quad (1)$$

where $h(x,a,y,B)$ is the impulse response or point-spread function for the system model. In this case the impulse is located at point $(a,B)$. The function $f(x,y)$ is the original surface profile or existing topography of the optic or other element, and the function $d(x,y)$ is the desired surface profile or predetermined surface topography. The function $t(a,B)$ is the time that the ion beam dwells on the element at point $(a,B)$. The function $h(x,a,y,B)$ is the material removal profile for the ion beam.

The material removal profile described as $h(x,a,y,B)$ is spatially variant. The shape of the removal profile can change depending on where the ion beam is pointed. If the removal profile is found not to change with position, then the removal profile is said to be position invariant or spatially invariant. The removal function may also have additional parameters related to dynamically changing the mechanical and electromagnetic configuration of the ion source.

Figuring can also be performed by depositing material using a deposition source. In this case the removal function is replaced with an addition function which satisfies the same constraints as the removal function. Those skilled in the art will understand the calculations of the control parameters using additive techniques, e.g., ion deposition, are the same as the calculations of the control parameters for material removal, e.g., ion etching.

For surfaces containing no large slope changes the removal or deposition profile is spatially invariant for the ion sources used in practicing the invention. Surfaces having significant curvature will have spatially variant removal or deposition profiles.

All of the functions but $t(a,B)$ are known. To perform surface figuring, the function $t(a,B)$ must be calculated. Because surface figuring in accordance with the preferred embodiment of the invention is under digital control, metrology and instrumentation, the integrals of equation 1 are replaced with summations and the domain is discrete. For the spatially invariant case, the superposition summation reduces to the definition of the discrete convolution.

$$f(x,y) - d(x,y) = \sum_a \sum_B t(a,B)h(x-a,y-B). \quad (2)$$

Equation 2 can be solved using matrix techniques. However, using orthogonal transforms is easier and provides insight into the success or failure of the figuring operation.

An orthogonal transform such as the Fourier, Hadamard, Hartley, Cosine, and the like, has the property of diagonalizing a circulant (one dimensional) or block-circulant (two dimensional) matrix. This means that the solution to equation 2 in terms of $t(a,B)$ can be obtained using algebraic techniques.

Let F be an orthogonal transform. Taking the transform of both sides of equation 2 gives $$F(u,v) - D(u,v) = T(u,v)H(u,v). \quad (3)$$

where F is the transform of $f(x,y)$, D is the transform of $D(x,y)$, etc. Equation 3 can be rearranged to form $$T(u,v) = \frac{F(u,v) - D(u,v)}{gH(u,v)} \quad (4)$$

where g is a multi-variate function used to control the division when $H(u,v)$ approaches zero or when $F-D$ becomes noisy. When $g=1$, equation 4 is called an inverse filter. When g is a function of the signal-to-noise ratio at the transform coordinate $(u,v)$, equation 4 is a Least Squares or Wiener filter. The function g can be optimized to produce a time dwell array $t(x,y)=F^{-1}F(u,v)$ which has optimal or special properties when applied as the time dwell array for an ion beam figuring operation.

Filters constructed using equation 4 are called restoration, deblurring or deconvolution filters and are used extensively in image processing and system controls.

Once all of the functions in equation 2 are known the residuals arising from the ion figuring process can be calculated by forming $$E(u,v) = F(u,v) - D(u,v) - T(u,v)H(u,v) \quad (5)$$

for different conditions applied with g. $E(u,v)$ is the error between the desired surface and what can actually be achieved with a well characterized ion figuring process. In accordance with the invention, by looking at $e(x,y)=F^{-1}E(u,v)$, one can evaluate the prospects for a successful figuring operation before any work is actually done. This step provides for the rejection of those optical or other elements which have surfaces that are economically or otherwise unsuitable for ion beam figuring by removal or deposition.

For the case where the ion beam removal or deposition function is spatially variant, the time dwell array, calculated using matrix methods, is represented by $$r = Ht \quad (6)$$

where r is a vector formed by stacking the rows of $f(x,y)-d(x,y)$, t is formed by stacking the rows of $t(x,y)$, and H is formed by stacking partitions formed by stacking the rows of the point-spread function $h(x,a,y,B)$ for each $(a,B)$. The matrix H is the spatially variated point-spread-function (PSF) matrix. The time array is recovered by forming $$t = H^{-1}r \quad (7)$$

where $H^{-1}$ is the inverse of the matrix H. When the point-spread function is spatially invariant, H can be diagonalized by an orthogonal transform as described previously.

The matrix H is somewhat ill-conditioned, meaning that small amounts of noise or error present in the matrix coefficients will have a large effect on the coefficients in the inverse matrix. To help alleviate this problem, the inverse matrix can be calculated using Singular Value Decomposition (SVD) or Q-R or other decompositions where unstable vectors are removed from the inverse calculation. This produces an approximation to the solution, but one that has higher tolerance to noise. Iterative constrained conjugate gradient optimization can also be used to perform the calculation for the inverse PSF matrix.

The use of the constraints or vector removal corresponds to the use of $g \neq 1$ in equation 4. An estimate of the residuals after figuring with a well characterized ion beam figuring process can be found by forming $$e = r - \widehat{H}^{-1} t \qquad (8)$$

where $H^{-1}$ is the calculated inverse point-spread matrix. The error vector can then be unstacked to form an error image which can be inspected for figurability just as in the spatially invariant case.

Edge effects are produced with conventional figuring techniques due to the inherent properties of polishing tools. For efficient material removal a tool should be fairly stiff. As the tool moves so that part of it extends beyond the edge of the element being figured, pressure increases on the part of the surface in contact with the tool and the removal profile distorts. The edges roll over about the radius of the tool to cause an edge effect. Although many attempts have been made to solve this problem in conventional grinding or milling, the effect remains. Similar problems exist in all types of surface contact tools and devices for material removal.

In ion beam figuring, removal and deposition profiles do not depend on mechanical supports and the ion beam profile remains the same whether or not an object to be figured is in place. Thus, optics and other elements having essentially no edge effects can be produced. Because the beam dwell array value at a given point depends on the condition of the surface in a region around that point about the width of the removal or deposition function, the dwell array value depends in part on a condition which does not exist, since it is off the edge of the element. In practicing the invention the image of the element provided by the metrology is treated as a small piece on an infinite surface. Using this model, the surface of the element is imagined to be a snapshot through an aperture of the surface map of a much larger element extending far beyond the field of view of the metrological instrumentation. Data is constructed to fill in those parts of the surface map which would correspond to those parts of the larger element obscured by the aperture. Hence the image restoration or matrix solutions see an element with no edges and compute correct dwell array for such an element. The constructed data must have the same properties in terms of surface structure as the original element because there should be a match of the real data with the non-physical data at the edge of the element.

Construction of nonphysical data is achieved with Band Limited Surface Extrapolation (BLSE) using orthogonal transforms. Original data is filtered to provide a smoothed result with some data outside the original data. The original data is then reinserted into the resultant image. These steps are repeated a number of iterations to build up data outside the original data, limited in frequency content by the filter which provides the band limits.

Convergence can be slow, even converging an over infinite iterations. Since ideal filters introduce "ringing" artifacts into the image, variable order filters such as Butterworth, Chebyshev, or other more advanced filters can be used. In practicing the invention, the cutoff frequency of the filter is varied during the progressive iterations, typically proceeding from higher bandwidths to lower bandwidths, with the final iterations being performed using the transform of the ion beam removal or deposition function as the filter. The ion beam removal or deposition function is the ultimate filter because it eliminates any frequencies not present in the ion beam itself, alleviating restoration difficulties in equation 4.

To further speed the convergence, the filters are set during early iterations to amplify, in some cases nonlinearly, some of the frequencies in the pass band. This builds up the nonphysical data area more quickly than when conventional normalized filters are used.

Additional gains in edge smoothness are obtained in some cases by offsetting the optical surface with respect to its reference plane. This costs additional figuring time during which the centroid of the ion beam is mostly off the surface of the element being figured. However, this produces higher quality edge figuring.

The invention is applicable to the production of large optical or other surfaces due to its inherent scalability. As the size of a work piece is increased, ion beam current can be increased by using larger ion sources or by using a plurality of small ion sources which can be run simultaneously. The use of a plurality of sources reduces the time needed to figure a particular surface and distributes the thermal load across the surface of the element during figuring to thereby reduce thermally induced distortion. The plurality of sources may all be of the same size or more likely, of different selected sizes to minimize element figuring time. The use of several size ion sources also provides figuring over large spatial frequency bands which results in a better final surface figure. Spatial ion beam current density can be dynamically tuned using single or plural sources in practicing the invention to provide an optimal final surface figure.

Because weight loading due to gravity and forces applied in conventional figuring techniques and mechanical distortion caused by polishing tool weight are eliminated, very light weight and flexible optical and other elements can be figured using the invention.

Figure 2:
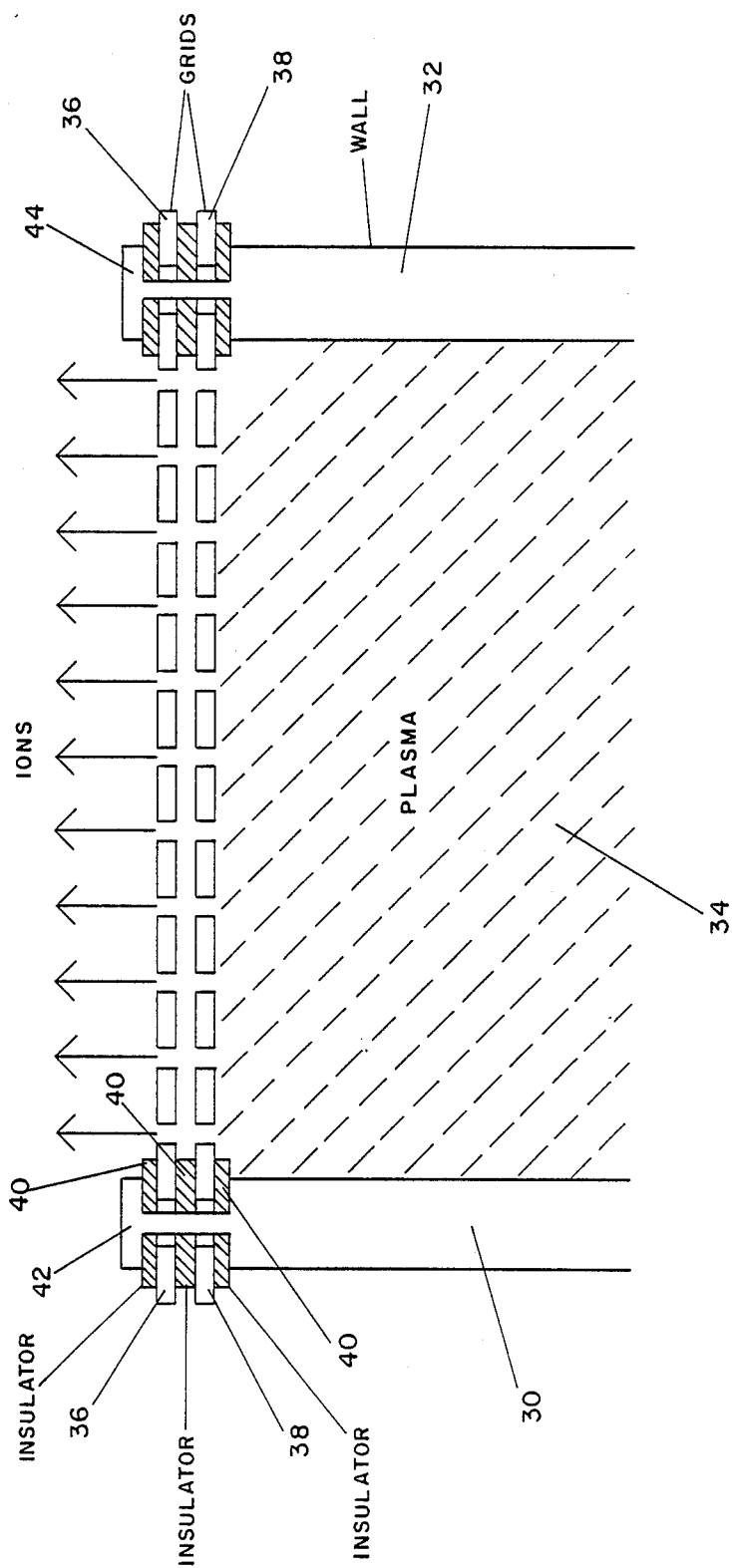
FIG. 2 shows a cross section of an ion beam grid structure representative of those of the prior art.

Referring now to FIG. 2 which shows a typical prior art Kaufman ion source grid structure for ion beam generation, as seen therein, walls 30 and 32 contain a plasma 34 as a source of ions. A pair of grids 36 and 38 of metal or other suitable conductive material comprising perforated sheet stock are spaced apart with insulators 40 and disposed on extensions 42 and 44 of walls 30 and 32, respectively. Ions as indicated by the arrows are accelerated from the plasma through the performations in the grid by appropriate voltage applied across the grids 36 and 38. As will be appreciated by those skilled in the art, the grid is rather delicate and readily subject to misalignment, damage and disablement because it is dependent on the strength of the metal or other conductive material for structural integrity. Too, this prior art grid apparatus is limited to a single voltage differential in that its conductive material can not be separated into discrete, spaced, corresponding areas to which different voltages can be applied, as in practicing the instant invention.

Figure 3A:
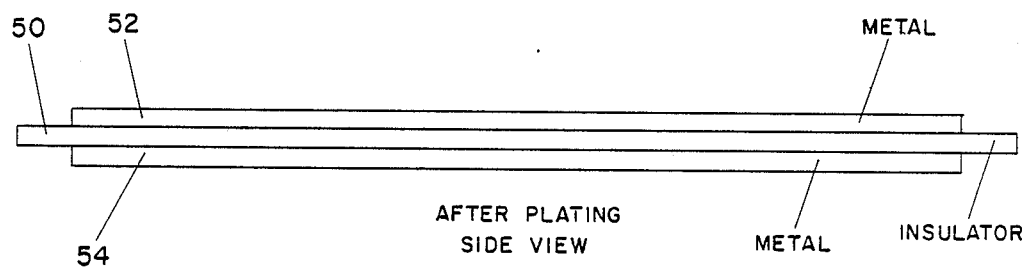
FIGS. 3A and 3B are cross sectional views of an ion beam grid apparatus in accordance with the invention.
Figure 3B:
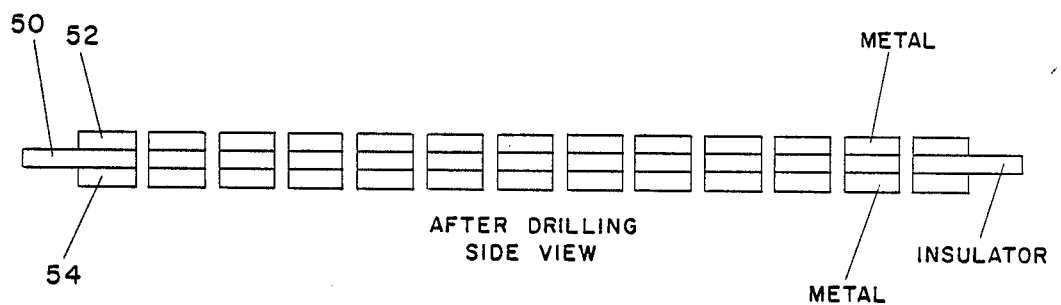

FIGS. 3A and 3B are cross sectional views of an ion grid apparatus in accordance with the invention showing a nonconductive sheet 50 which may, for example, comprise a ceramic or other vacuum compatible nonconductive material and which is preferably about 0.025 inch to about 0.020 inch thick. The surfaces of the sheet 50 are covered with conductive layers 52 and 54 which may comprise electroplated coatings, metal foil, vacuum deposited coatings, and the like. In practicing the invention, those skilled in the art will recognize suitable metals or other conductive materials for constructing the layers and suitable techniques for their fabrication. FIG. 3A shows a layered sheet before apertures are drilled or otherwise provided, whereas FIG. 3B shows the structure of FIG. 3A with apertures placed therein. The invention as shown in FIG. 3B functions with a plasma source and the sheet 50 may be simply fastened to the ends of the walls of the source.

The FIG. 3B embodiment may comprise perforations in any selected or desired pattern in order to provide an ion beam of a predetermined spatial distribution. For example, FIG. 7A shows an essentially Gaussian distribution of beam current density achieved with uniform aperture spacing on the grid structure. FIG. 7B shows how spatial distribution can be varied by varying aperture spacing. The graph depicts beam current density for the grid aperture spacing schematically illustrated below its X axis.

Figure 4:
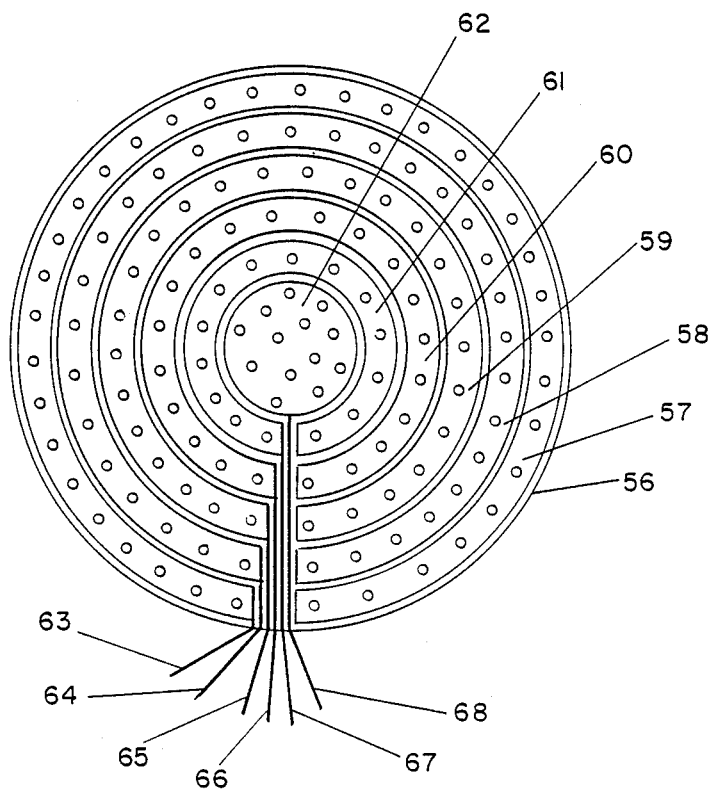
FIG. 4 illustrates an ion beam grid apparatus in accordance with the invention having discrete coating areas connectable to separate voltages.
Figure 5:
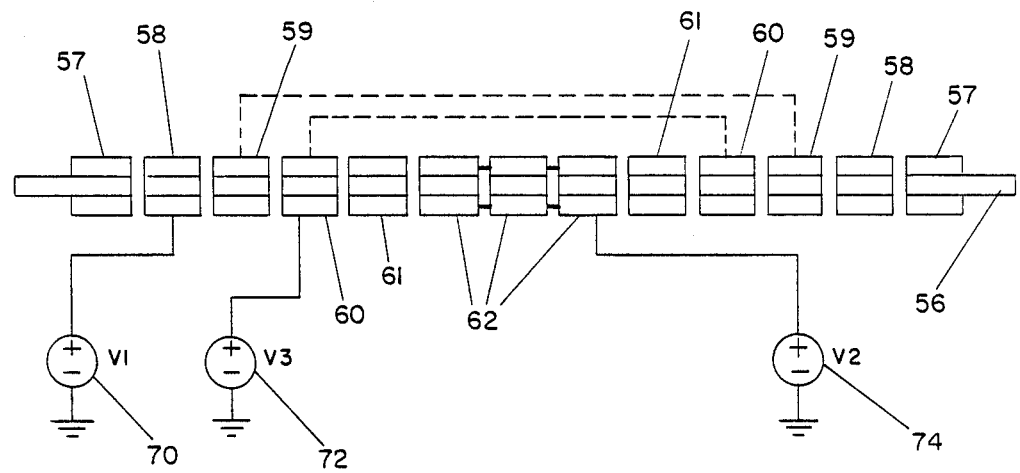
FIG. 5 is a cross sectional view of the embodiment of FIG. 4 schematically showing the discrete coating areas connected to different voltage sources.
Figure 6A:
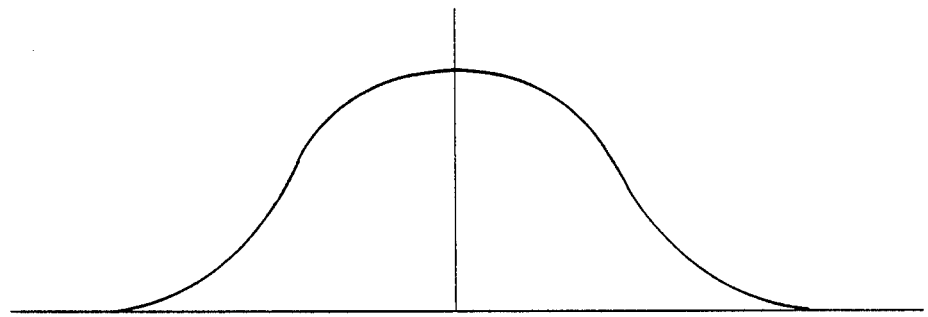
FIGS. 6A and 6B graphically depict ion beam spatial distribution as it may be controlled by the embodiment of FIGS. 4 and 5.
Figure 6B:
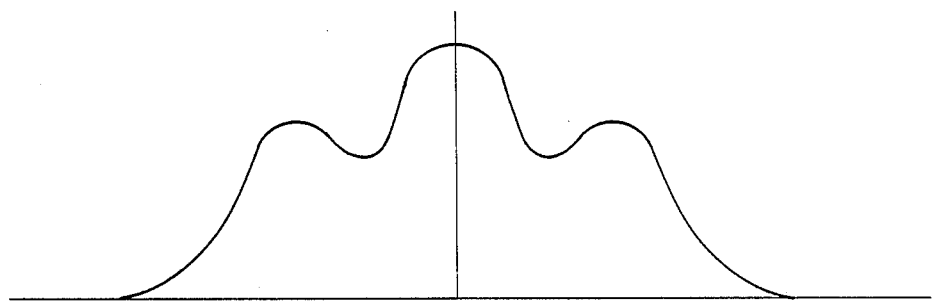

Spatial distribution of beam current density can be selectively varied in accordance with the invention using the grid apparatus shown in FIG. 4 which shows a conductive layer disposed on one side of a sheet 56 in separate and discrete areas. The other side of sheet 56 contains a similar corresponding pattern of areas of conductive layer. Thus, the conductive layer on each side of the sheet comprises separate and discrete areas corresponding to, and essentially mirror images of, the separate and discrete areas on the opposite side of the sheet. As seen therein, a sheet 56 contains separate areas 57, 58, 59, 60, 61 and 62 of conductive layer. Conductive leads 63, 64, 65, 66, 67, and 68 connect areas 57-62 to different sources of voltages as seen in FIG. 5 which schematically shows voltage sources 70, 72 and 74 connecting through appropriate leads to provide separate, preferably individually controllable, voltage potentials across corresponding areas on each side of the sheet. Thus, the various conductive areas and their opposing mirror image areas are operable at corresponding voltages. The various voltages may be the same or different, depending on a particular operation. The voltages may be preselected and fixed or they may be variable either manually by an operator or under automatic control. FIGS. 6A and 6B show beam current density as a function of voltage for the FIG. 5 embodiment. In FIG. 6A, voltages V1, V2 and V3 are all 500 volts. FIG. 6B shows beam current density for V1 and V2 at 500 volts and V3 at zero volts. The circular central area 62 surrounded by concentric circles 61–57 is for purpose of illustration of a preferred embodiment and area configuration is not limited thereto. Similarly, the number of sets of corresponding areas shown are for illustration only, and any number of one or more sets of corresponding areas may be used in practicing the invention. The invention is additionally not limited to the aperture distribution shown for purposes of illustration only, and those skilled in the art will recognize other aperture patterns can be used to practice the invention. Those skilled in the art will also recognize voltages, grid apparatus size and aperture size suitable for use in particular applications in order to practice the invention.

The various grid structures described can be used to practice the method of the invention, which is particularly suitable for figuring the surfaces of large optics and other elements.

In practicing the invention, after a surface is configured, it may be coated with an additional material. Thus, the invention can be used to manufacture a mirror by etching or depositing material to figure a surface and then coating the surface with a reflective coating. Similarly, a nonreflective or other coatings may be added to an element figured in accordance with the invention. The method of the invention is particularly useful to coat elements which are damaged when heated, since many conventional coating techniques require the substrate be heated to from 150° to 300° C. Ion assisted deposition of coatings may be carried out using a magnetron or other such device. Too, ion etching can be applied to a coated element to alter coating thickness to provide a desired coating thickness profile.

The invention has been described in detail with particular reference to preferred embodiments thereof, but it will be understood that variations and modifications can be effected within the scope of the invention.

We claim:

1. A method for ion etching a selected surface of an object from its existing topography to a predetermined topography, the method comprising the steps of:
    (a) comparing the existing topography of the surface to the predetermined topography,
    (b) using an algorithm comprising image restoration, etching the surface with an ion beam to remove selected material therefrom, thereby causing the surface to reach the predetermined topography.

2. The invention of claim 1 further comprising depositing material on selected portions of the surface in accordance with the algorithm to cause the surface to reach the predetermined topography.

3. The invention of claim 1 wherein the predetermined topography is symmetric.

4. The invention of claim 1 wherein the predetermined topography is nonsymmetric.

5. The invention of claim 1 wherein the ion beam is a high current, low energy, broad beam.

6. The invention of claim 1 wherein the ion beam has a current between about 0.2 kV and about 2 kV, an energy between about 800 eV and about 1500 eV and focuses to between about 2 and 5 centimeters and larger in diameter.

7. The invention of claim 1 further comprising using surface extrapolation to avoid edge effects.

8. The invention of claim 1 wherein said algorithm is:

$$t(x,y) = F^{-1}\left[F(u,v) = \frac{D(u,v)}{\gamma H(u,v)}\right]$$

where at $t(x,y)$ the ion beam is at each point $(x,y)$
    $F(u,v)$ is the orthogonal transform of a predetermined surface,
    $D(u,v)$ is the orthogonal transform of the desired surface profile, H(u,v) is the orthogonal transform of the surface material modification profile, $F^{-1}$ is the inverse orthogonal transform of the forward transform used to form F, D and H, and $\gamma$ is the multivariate parameter.

9. The invention of claim 1 wherein the beam has a profile of substantially Gaussian shape.

10. The invention of claim 1 wherein the beam emerges from a grid comprising a plurality of discrete sources spaced in a predetermined pattern.

11. The invention of claim 10 further comprising controlling the spatial distribution of the ion beam.

12. The invention of claim 10 wherein said pattern comprises a plurality of concentric circles.

13. A method of sorting unprocessed objects having a surface with a topography suitable for surface etching to a predetermined topography from those having surface topographies not suitable for etching, the method comprising the steps of:
(a) comparing the existing topography of the object's surface considered for etching with the predetermined surface topography using an algorithm utilizing image restoration to determine whether a selected object comprises a surface having an existing topography which can be etched to the predetermined topography in accordance with preselected criteria,
(b) accepting for etching those objects comprising surfaces which can be etched within the preselected criteria, and
(c) rejecting those objects which do not comprise surfaces meeting the criteria.

14. The invention of claim 13 wherein the criteria comprise time as a criterion.

15. The invention of claim 13 further comprising the step of ion etching the surfaces of the objects meeting the preselected criteria in accordance with the algorithm.

16. The invention of claim 13 wherein the algorithm comprises deblurring and image restoration calculations for the computation of a beam dwell array.

17. An ion source grid apparatus for extracting ions from a source plasma, said apparatus comprising:
a two surface sheet of nonconductive material;
a conductive layer disposed on each surface of said sheet;
a plurality of apertures penetrating both said conductive layers and said sheet in a predetermined pattern for providing an ion beam having a preselected spatial distribution; and
means for supplying electrical voltage across said layers.

18. The invention of claim 17 wherein said plurality of apertures are disposed within a substantially circular central region and at least one circle concentric thereto.

19. An ion source grid apparatus for extracting ions from a source plasma, said apparatus comprising:
a two surface sheet of nonconductive material;
like conductive layers disposed on each surface of said sheet, each layer comprising a plurality of separate and discrete areas, said like layers comprising corresponding areas;
a plurality of apertures penetrating, within said discrete areas, both said conductive layers and said nonconductive sheet in a predetermined pattern for providing ion beam having a preselected spatial distribution; and
means for supplying a selected electrical voltage across each said corresponding area of said like conductive layers to provide an ion beam of a desired spatial distribution.

20. The invention of claim 19 comprising means for controlling each selected voltage to change said desired ion beam spatial distribution in accordance with said voltages.

21. The invention of claim 19 wherein said corresponding layer areas essentially comprise a substantially circular central area and at least one circle concentric thereto.

* * * * *